United States Patent
Yamawaku et al.

(10) Patent No.: US 9,236,226 B2
(45) Date of Patent: Jan. 12, 2016

(54) PLASMA PROCESSING APPARATUS

(75) Inventors: Jun Yamawaku, Yamanashi (JP);
Takafumi Kimura, Yamanashi (JP);
Chishio Koshimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 437 days.

(21) Appl. No.: 13/428,512

(22) Filed: Mar. 23, 2012

(65) Prior Publication Data

US 2012/0241092 A1    Sep. 27, 2012

Related U.S. Application Data

(60) Provisional application No. 61/472,667, filed on Apr. 7, 2011.

(30) Foreign Application Priority Data

Mar. 25, 2011 (JP) .................................. 2011-067523

(51) Int. Cl.
*H01L 21/00* (2006.01)
*H01J 37/32* (2006.01)

(52) U.S. Cl.
CPC ..... *H01J 37/32091* (2013.01); *H01J 37/32669* (2013.01)

(58) Field of Classification Search
CPC ..................... H01J 37/32669; H01J 37/32678; H01J 37/32688
USPC ....... 118/723 E; 156/345.43, 345.44, 345.45, 156/345.46, 345.47
See application file for complete search history.

(56) References Cited

U.S. PATENT DOCUMENTS

| | | | | |
|---|---|---|---|---|
| 4,581,118 A * | 4/1986 | Class et al. | ............... | 204/298.16 |
| 5,444,207 A * | 8/1995 | Sekine et al. | ............ | 219/121.43 |
| 5,733,405 A * | 3/1998 | Taki et al. | ............... | 156/345.46 |
| 6,000,360 A * | 12/1999 | Koshimizu | ............... | 118/723 E |
| 6,077,384 A * | 6/2000 | Collins et al. | ............ | 156/345.29 |
| 6,432,261 B2 * | 8/2002 | Watanabe et al. | ........ | 156/345.47 |
| 7,846,293 B2 * | 12/2010 | Iwasaki et al. | ............ | 156/345.46 |
| 2003/0102087 A1* | 6/2003 | Ito et al. | .................... | 156/345.46 |
| 2004/0238125 A1* | 12/2004 | Ono et al. | ................ | 156/345.46 |
| 2006/0081559 A1* | 4/2006 | Miyata et al. | ................... | 216/67 |
| 2008/0260966 A1* | 10/2008 | Hanawa et al. | ............... | 427/569 |

FOREIGN PATENT DOCUMENTS

| | | | |
|---|---|---|---|
| JP | 62229945 A | * | 10/1987 |
| JP | 05-013374 A | | 1/1993 |
| JP | 07-161488 A | | 6/1995 |
| JP | 09-263949 A | | 10/1997 |
| JP | 10-152775 A | | 6/1998 |
| JP | 2001-197717 A | | 7/2001 |

* cited by examiner

*Primary Examiner* — Sylvia R MacArthur
*Assistant Examiner* — Anna Crowell
(74) *Attorney, Agent, or Firm* — Pearne & Gordon LLP

(57) ABSTRACT

In the plasma processing apparatus 10, a processing space S is formed between a susceptor 12 and an upper electrode 13 facing the susceptor 12. The plasma processing apparatus 10 includes a magnetic field generating unit provided at a side of the upper electrode 13 opposite to the processing space S. The magnetic field generating unit includes a magnetic force line generating unit 27 having a pair of annular magnet rows 27a and 27b. The annular magnet rows 27a and 27b are provided at the side of the upper electrode 13 opposite to the processing space S and arranged concentrically when viewed from the top. In the magnetic force line generating unit 27, an angle θ1 formed by axial lines of magnets of the annular magnet rows 27a and 27b is set to be in a range of about $0° < θ1 ≤ 180°$.

15 Claims, 9 Drawing Sheets

(A)

(B)

(A)

(B)

(C)

(A)

(B)

PLASMA PROCESSING APPARATUS

CROSS-REFERENCE TO RELATED APPLICATION

This application claims the benefit of Japanese Patent Application No. 2011-067523 filed on Mar. 25, 2011, and U.S. Provisional Application Ser. No. 61/472,667 filed on Apr. 7, 2011, the entire disclosures of which are incorporated herein by reference.

FIELD OF THE INVENTION

The present disclosure relates to a plasma processing apparatus that controls a plasma density distribution by an electric field and a magnetic field.

BACKGROUND OF THE INVENTION

There is known a capacitively coupled plasma processing apparatus configured to generate plasma in a processing space between circular plate-shaped upper and lower electrodes arranged parallel to each other and to perform a required process on a substrate such as a semiconductor wafer (hereinafter, simply referred to as a "wafer") by the plasma. In such a capacitively coupled plasma processing apparatus, plasma density corresponding to a central portion of the upper electrode or the lower electrode is increased, and plasma density distribution in the entire processing space tends to become non-uniform.

To solve the problem, the present inventors have proposed a plasma processing apparatus 115 as depicted in FIG. 10 (see, for example, Patent Document 1). In this plasma processing apparatus 115, an upper electrode is divided into an inner electrode 110 and an outer electrode 111 surrounding the inner electrode 110. High frequency powers are independently applied to the inner electrode 110 and the outer electrode 111, and an electric field in a processing space (hereinafter, referred to as an "inner space") corresponding to the inner electrode 110 and an electric field in a processing space (hereinafter, referred to as an "outer space") corresponding to the outer electrode 111 are also individually controlled. Further, permanent magnet rows 112 to 114 are concentrically arranged on a top surface of the upper electrode about the center of the upper electrode, and a magnetic field is generated at a desired position within the processing space.

In this plasma processing apparatus 115, by individually adjusting the electric field in the inner space and the electric field in the outer space, plasma density in the inner space and plasma density in the outer space are independently controlled.

Further, in the plasma processing apparatus 115, circular ring-shaped magnetic force lines 116 and 117 concentrically distributed about the center of the upper electrode are respectively generated between the permanent magnet rows 112 and 113 and between the permanent magnet rows 113 and 114. Magnetic fields generated by these magnetic force lines 116 and 117 are formed in the inner space and in the outer space, and electrons within the inner space and the outer space are drifted by a Lorentz force in directions orthogonal to the magnetic force lines 116 and 117 (in the drawing, marks such as '●' indicate drift directions of the electrons). At this time, the electrons drifted by the Lorentz force revolve around the center of the upper electrode at the vicinity of the surface of the upper electrode. The revolving electrons collide with molecules and atoms of a processing gas, and thus, plasma is generated. As a result, circular ring-shaped plasma distributed about the center of the upper electrode can be generated so as to correspond to the magnetic field.

In this plasma processing apparatus 115, the plasma density in the inner space and the plasma density in the outer space are independently controlled, and a multiplicity of circular ring-shaped plasma is generated. As a result, plasma density distribution in the entire processing space can be effectively controlled.

Patent Document 1: Japanese Patent Laid-open Publication No. H10-152775

However, the present inventors have conducted researches repeatedly and found out that the conventional plasma processing apparatus has the following issues. The magnetic field generated in the processing space has a horizontal component parallel to the upper and lower electrodes and a vertical component perpendicular to the upper and lower electrodes. The horizontal component is effectively used for controlling the plasma density within the processing space by individually controlling the electric field and the magnetic field. However, the vertical component complicates the relationship between the magnetic field and the electric field in the processing space, and the plasma density distribution in the processing space may not be controlled.

BRIEF SUMMARY OF THE INVENTION

In view of the foregoing problems, illustrative embodiments provide a plasma processing apparatus capable of effectively controlling a plasma density distribution in a processing space by providing a magnet on an upper electrode, while removing an adverse effect from a vertical component by reducing the vertical component of a magnetic field generated in the processing space.

In accordance with an aspect of an illustrative embodiment, there is provided a plasma processing apparatus, having a lower electrode and an upper electrode facing the lower electrode, for performing a plasma process on a substrate mounted on the lower electrode by generating plasma in a processing space between the lower electrode and the upper electrode. The plasma processing apparatus includes a magnetic field generating unit provided at a side of the upper electrode opposite to a side facing the processing space. Here, a vertical component of a magnetic field generated in the processing space by the magnetic field generating unit may be smaller than a horizontal component thereof.

The magnetic field generating unit may include at least one magnetic force line generating unit having a pair of annular magnet rows. Further, the pair of annular magnet rows may be provided at the side of the upper electrode opposite to the side facing the processing space and arranged concentrically when viewed from the top. Furthermore, the pair of annular magnet rows in the at least one magnetic force line generating unit may be arranged such that an angle $\theta1$ formed by axial lines of magnets of the pair of annular magnet rows is set to be in a range of about $0°<\theta1 \leq 180°$. Moreover, one end portions of the pair of annular magnet rows opposite to the processing space may be magnetically connected to each other. Further, magnetic force lines reaching the processing space may be generated between the other end portions of the pair of annular magnet rows facing the processing space.

In the plasma processing apparatus, the angle $\theta1$ may be set to be an acute angle.

In the plasma processing apparatus, the angle $\theta1$ may be set to be about 90°.

In the plasma processing apparatus, the angle $\theta1$ may be set to be about 180°.

The magnetic field generating unit may include at least one magnetic force line generating unit having a pair of annular magnet rows and two yokes. Further, the pair of annular magnet rows may be provided at the side of the upper electrode opposite to the side facing the processing space and arranged concentrically when viewed from the top. Furthermore, the two yokes may be respectively connected to one end portions of the pair of annular magnet rows facing the processing space. Moreover, the pair of annular magnet rows in the at least one magnetic force line generating unit may be arranged such that an angle θ2 formed by axial lines of the two yokes is set to be in a range of about 0°<θ2≤180°. Further, the other end portions of the pair of annular magnet rows opposite to the one end portions facing the processing space may be magnetically connected to each other. Furthermore, magnetic force lines reaching the processing space may be generated between end portions of the two yokes connected to the one end portions of the pair of annular magnet rows facing the processing space.

In the plasma processing apparatus, the angle θ2 may be set to be an acute angle.

In the plasma processing apparatus, the angle θ2 may be to be about 90°.

In the plasma processing apparatus, the angle θ2 may be to be about 180°.

A DC power supply or a high frequency power supply may be connected between the upper electrode and the lower electrode.

The at least one magnetic force line generating unit may be configured to be movable toward or away from the processing space.

The at least one magnetic force line generating unit may be plural in number, and the magnetic force line generating units may be configured to be individually movable toward or away from the processing space.

One of the pair of annular magnet rows in the at least one magnetic force line generating unit may be configured to be independently movable toward or away from the processing space.

The at least one magnetic force line generating unit may be plural in number. A protrusion may be formed at a yoke connected to one of the pair of annular magnet rows in one magnetic force line generating unit and is protruded toward a yoke connected to one of the pair of annular magnet rows in adjacent other magnetic force line generating unit. Further, a distance between the yokes in two adjacent magnetic force line generating units when the protrusion is formed may be smaller than a distance between yokes when the protrusion is not formed.

The one end portions of the pair of annular magnet rows opposite to the processing space may be magnetically connected to each other via an annular yoke when viewed from the top.

The one end portions of the pair of annular magnet rows opposite to the processing space may be magnetically connected to each other with a gap therebetween.

The at least one magnetic force line generating unit may include a single magnet row and a yoke whose one end is connected to an end portion of the magnet row opposite to the processing space and the other end faces the processing space.

The at least one magnetic force line generating unit may include a permanent magnet row having a reverse U-shaped cross section that is opened toward the processing space.

In accordance with the illustrative embodiments, in the plasma processing apparatus configured to control a plasma density distribution in the processing space by the magnet provided on the upper electrode, it is possible to remove an adverse effect from a vertical component by reducing the vertical component of a magnetic field generated in the processing space. As a result, it is possible to effectively control the plasma density distribution in the processing space.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 7(A) is a plane view of a circular ring-shaped yoke as a single body, and FIG. 7(B) is a plane view of a circular ring-shaped yoke formed by combining semicircular ring-shaped yokes;

FIG. 8(A) is a schematic perspective view partially showing a cross section of a pair of magnetic force line generating units that forms a magnetic field generating unit when it is cut in a vertical direction, FIG. 8(B) is a plane view showing a part of yokes connected to end portions at the processing space side of facing magnet rows in the pair of magnetic force line generating units shown in FIG. 8(A), and FIG. 8(C) is a cross sectional view of the magnetic force line generating units corresponding to cross sections of the yokes taken along a line I-I shown in FIG. 8(B);

FIG. 9(A) is a plane view showing a part of yokes connected to end portions at the processing space side of facing magnet rows in a pair of magnetic force line generating units that form a magnetic field generating unit, and FIG. 9(B) provides a cross sectional view of the magnetic force line generating units corresponding to cross sections of the yokes taken along a line II-II of FIG. 9(A)

DETAILED DESCRIPTION OF THE INVENTION

Hereinafter, illustrative embodiments will be described with reference to the accompanying drawings.

Firstly, a plasma processing apparatus in accordance with a first illustrative embodiment will be described.

Figure 1:
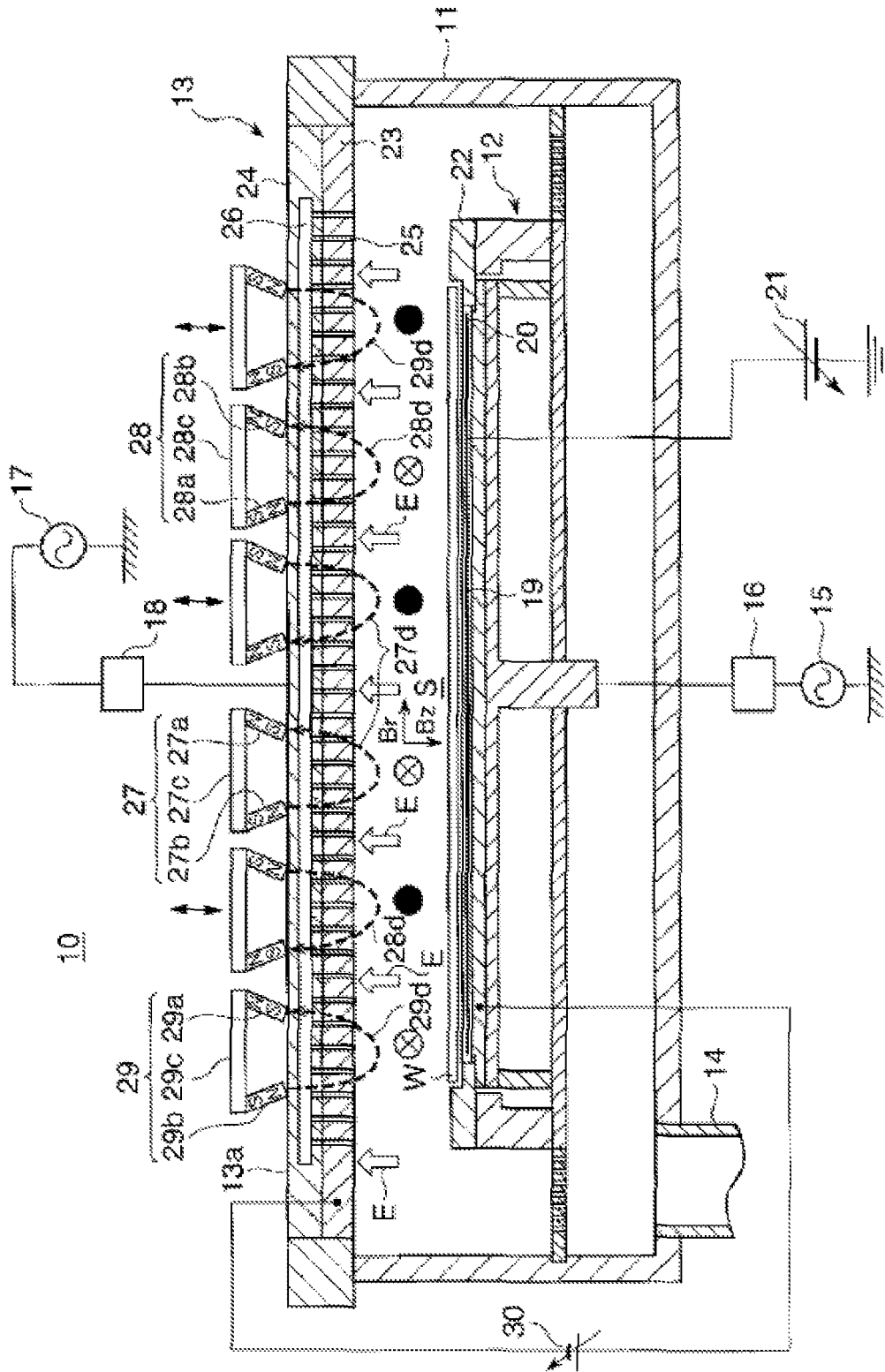
FIG. 1 is a schematic cross sectional view illustrating a configuration of a plasma processing apparatus in accordance with a first illustrative embodiment.
Figure 1A:
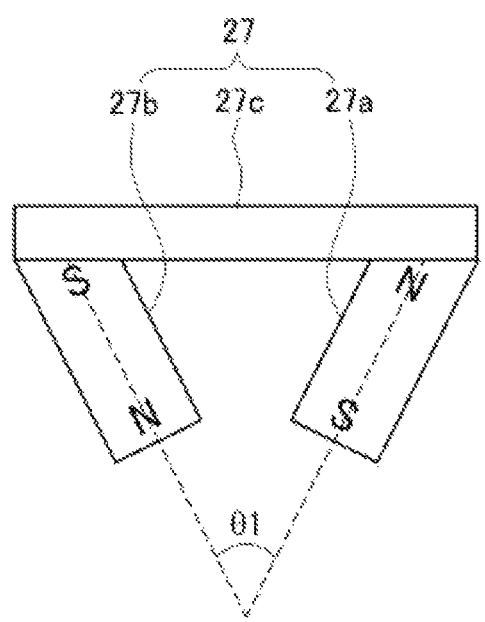
FIG. 1A is a schematic view of a magnetic force line generating unit of the plasma processing apparatus of FIG. 1, which defines an angle θ1.

FIG. 1 is a cross sectional view schematically illustrating a configuration of a plasma processing apparatus in accordance with the first embodiment. The plasma processing apparatus performs a plasma etching process on a wafer for a semiconductor device (hereinafter, simply referred to as a "wafer") as a substrate.

As shown in FIG. 1, the plasma processing apparatus 10 includes a cylindrical chamber 11 for accommodating therein a wafer W having a diameter of, e.g., about 300 mm. Within the chamber 1, a circular column-shaped susceptor 12 for mounting thereon the wafer W is provided, and a shower head 12 is provided so as to face the susceptor 12. A space between the susceptor 12 and the shower head 13 serves as a processing space S.

In the plasma processing apparatus 10, plasma is generated in the processing space S, and a plasma etching process is performed on the wafer W mounted on the susceptor 12 by the plasma. Further, a gas exhaust pipe 14 for exhausting a gas within the chamber 11 is connected to the chamber 11. The gas exhaust pipe 14 is connected to a TMP (Turbo Molecular Pump) and a DP (Dry Pump) (both are not shown), and these pumps evacuates and depressurizes the inside of the chamber 11. Further, an internal pressure of the chamber 11 is controlled by an APC valve (not shown).

A first high frequency power supply 15 is connected to the susceptor 12 within the chamber 11 via a first matching unit 16, and a second high frequency power supply 17 is connected to the shower head 13 via a second matching unit 18. The first high frequency power supply 15 applies a high frequency power having a relatively low frequency of, e.g., about 2 MHz for ion attraction to the susceptor 12. The second high frequency power supply 17 applies a high frequency power having a relatively high frequency of, e.g., about 60 MHz for plasma generation to the shower head 13. With this configuration, the susceptor 12 serves as a lower electrode, and the shower head 13 serves as an upper electrode. Further, the first matching unit 16 and the second matching unit 18 adjust impedance, and, thus, it is possible to maximize the efficiency of applying the high frequency powers to the susceptor 12 and the shower head 13.

A step-shaped portion is formed in an upper peripheral portion of the susceptor 12 such that a central portion of the susceptor 12 protrudes upward in the drawing. An electrostatic chuck 20, made of ceramics, having therein an electrostatic electrode plate 19 is provided on the central portion of the susceptor 12. A first DC power supply 21 is connected to the electrostatic electrode plate 19. When a positive DC voltage is applied to the electrostatic electrode plate 19, the wafer W is attracted to and held on the electrostatic chuck 20 by a Coulomb force or a Johnson-Rahbek force.

The susceptor 12 includes therein a cooling unit (not shown) such as a coolant path. The cooing unit absorbs heat of the wafer W, of which a temperature can be increased by being in contact with plasma. Therefore, it is possible to prevent the temperature of the wafer W from being increased higher than a desired level. Further, a focus ring 22 is mounted on the step-shaped portion in an upper portion of the susceptor 12 so as to surround the wafer W attracted to and held on the electrostatic chuck 20. The focus ring 22 is made of silicon (Si) or silicon carbide (SiC), and the plasma is distributed above the wafer W and the focus ring 22. Accordingly, plasma density above a peripheral portion of the wafer W can be maintained substantially the same as plasma density above a central portion of the wafer W.

The shower head 13 facing the susceptor 12 with the processing space S therebetween includes an upper electrode plate 23; and a cooling plate 24 for detachably supporting the upper electrode plate 23. The upper electrode plate 23 is configured as a circular plate-shaped member made of a conductive material or a semiconductor. A multiple number of holes 25 are formed through the upper electrode plate 23 in a thickness direction thereof. Further, a buffer room 26 is formed within the cooling plate 24, and a processing gas inlet (not shown) is connected to the buffer room 26.

In the plasma processing apparatus 10, a processing gas supplied into the buffer room 26 through the processing gas inlet is introduced into the processing space S through the gas holes 25. The introduced processing gas is excited into plasma by the high frequency power for plasma generation that is applied into the processing space S from the second high frequency power supply 17 through the shower head 13. Positive ions in the plasma are attracted toward the wafer W by the high frequency power for ion attraction that is applied to the susceptor 12 from the first high frequency power supply 15, and a plasma etching process is performed on the wafer W.

In accordance with the illustrative embodiment, the plasma processing apparatus 10 includes a multiple number of magnetic force line generating units 27 to 29 provided at a side of shower head 13 opposite to its side facing the processing space S. Each of the magnetic force line generating units 27 to 29 has an annular shape, e.g., a circular ring shape, and the magnetic force line generating units 27 to 29 serve as a magnetic field generating unit. To elaborate, the magnetic force line generating unit 27 mainly includes a pair of circular ring-shaped permanent magnet rows 27a and 27b arranged concentrically, i.e., in a concentric circular shape. The magnetic force line generating unit 28 mainly includes a pair of permanent magnet rows 28a and 28b arranged in, e.g., a concentric circular shape. The magnetic force line generating unit 29 mainly includes a pair of permanent magnet rows 29a and 29b arranged in, e.g., a concentric circular shape. On a top surface of the shower head 13 opposite to its surface facing the processing space S, the magnetic force line generating units 27 to 29 are disposed in a concentric circular shape about the center of the upper electrode plate 23 such that one magnetic force line generating unit is surrounded by another magnetic force line generating unit when viewed from the top. Further, the magnet rows of each of the magnetic force line generating units 27 to 29 may not have the same height in a vertical direction of FIG. 1.

In the pairs of magnet rows 27a and 27b, 28a and 28b, and 29a and 29b of the magnetic force line generating units 27, 28 and 29, permanent magnet rows are arranged such that same magnetic poles of the permanent magnet rows are adjacent to each other. For example, in the magnet rows 27a, 28b and 29a, the permanent magnets are arranged such that S poles face the processing space S. Meanwhile, in the magnet rows 27b, 28a and 29b, the permanent magnets are arranged such that N poles face the processing space S. Accordingly, the pair of magnet rows in each of the magnetic force line generating units 27 to 29 are arranged such that their magnetic poles facing the processing space S are different from each other.

In the magnetic force line generating units 27 to 29, one end portions of the magnet rows 27a and 27b opposite to the other end portions facing the processing space S are connected to each other by a yoke 27c; one end portions of the magnet rows 28a and 28b opposite to the other end portions facing the processing space S are connected to each other by a yoke 28c; and one end portions of the magnet rows 29a and 29b opposite to the other end portions facing the processing space S are connected to each other by a yoke 29c. By way of example, the yokes 27c, 28c and 29c are made of, but not limited to, iron.

Therefore, in the magnetic force line generating unit 27, the other end portions of the magnet rows 27a and 27b facing the processing space S are disconnected without being connected by a yoke. Further, since the magnetic poles at the other end portions of the magnet rows 27a and 27b are different from each other, magnetic force lines 27d are generated between the other end portions thereof. The intensity of the magnetic force lines 27d depends on a magnitude of a magnetic force. In the present illustrative embodiment, however, when the magnetic force line generating unit 27 is positioned near the top surface 13a of the shower head 13, the magnetic force lines 27d reach an upper region of the processing space S. Further, in the magnetic force line generating unit 28, the other end portions of the magnet rows 28a and 28b facing the processing space S are disconnected without being connected by a yoke. Since the magnetic poles at the other end portions of the magnet rows 28a and 28b are different from each other, magnetic force lines 28d are generated between the other end portions thereof. Furthermore, in the magnetic force line generating unit 29, the other end portions of the magnet rows 29a and 29b facing the processing space S are disconnected without being connected by a yoke. Since the magnetic poles at the other end portions of the magnet rows 29a and 29b are different from each other, magnetic force lines 29d are generated between the other end portions thereof. When the magnetic force line generating units 28 and 29 are positioned near the top surface 13a of the shower head 13, the magnetic force lines 28d and 29d also reach the upper region of the processing space S.

Meanwhile, since a second DC power supply 30 is connected between the upper electrode plate 23 of the shower head 13 and the susceptor 12 serving as the lower electrode, a negative DC voltage is applied to the upper electrode plate 23. As a result, an electric field E is generated in the processing space S. Accordingly, in the vicinity of the upper electrode plate 23, a region where the electric field E and a magnetic field formed by the magnetic force lines 27d, 28d and 29d intersect with each other is generated. In this region, electrons in the processing space S are drifted by Lorentz force caused by the electric field E and the magnetic field.

Figure 2:
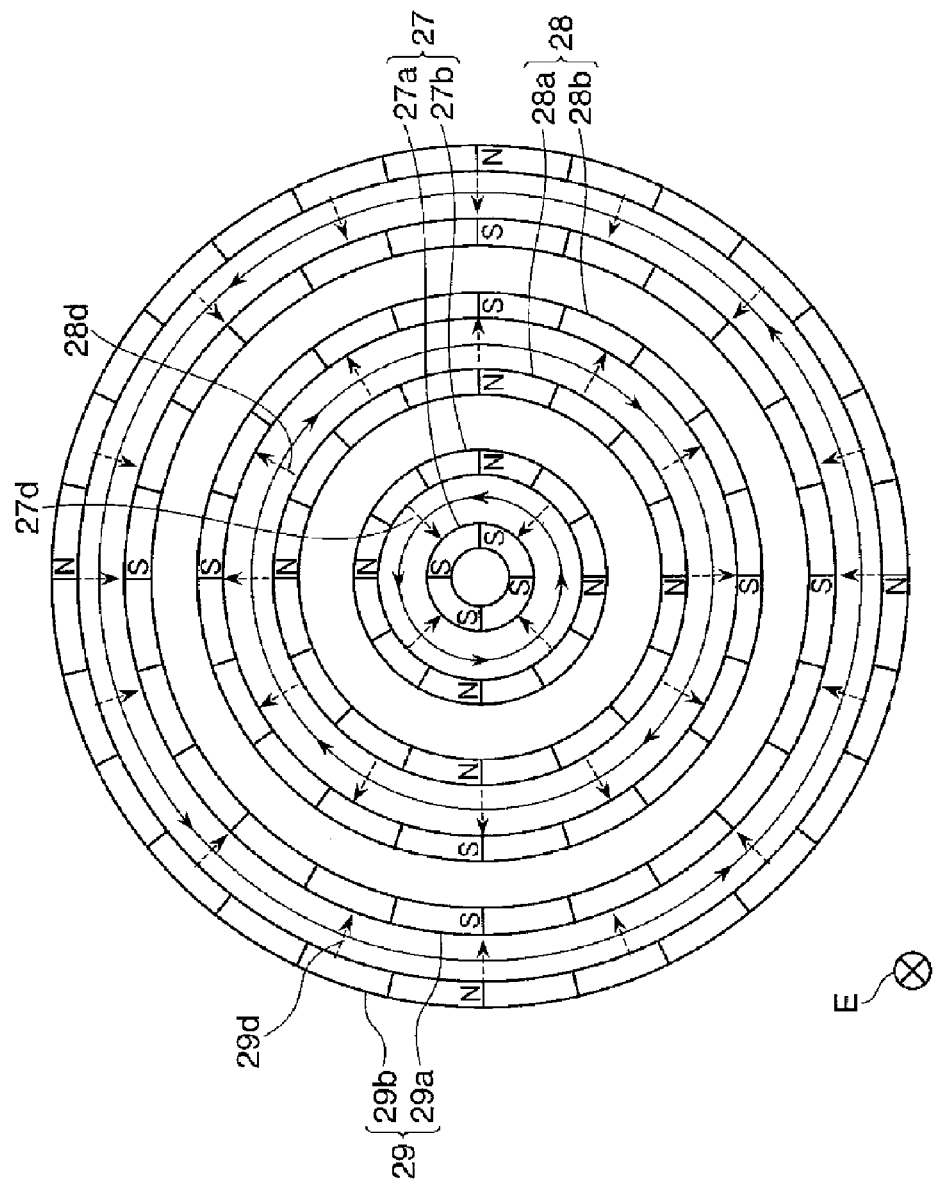
FIG. 2 is a bottom view of each magnetic force line generating unit of the plasma processing apparatus of FIG. 1 when viewed from a processing space.

FIG. 2 is a bottom view of the magnetic force line generating units 27 to 29 of the plasma processing apparatus of FIG. 1 when viewed from the processing space S. In FIG. 2, illustration of the shower head 13 is omitted. Since the magnet rows of each of the magnetic force line generating units are inclined at a certain angle with respect to a vertical line, the illustration thereof would be complicated. Thus, for the simplicity of illustration, only end surfaces of the magnet rows facing the processing space S are illustrated in FIG. 2.

Referring to FIG. 2, in a region corresponding to the magnetic force line generating unit 27, a magnetic field is generated by the magnetic force lines 27d (see dashed-line arrows of FIG. 2) radially distributed from the center of the magnetic force line generating unit 27, i.e., from the magnet row 27b toward the magnet row 27a. At this time, by setting an angle θ1 formed by axial lines of the magnets of the magnet rows 27a and 27b to be an acute angle, e.g., about 45°, a vertical component Bz of the magnetic field generated by the magnetic force lines 27d is sufficiently reduced as compared to a horizontal component Br thereof. Thus, adverse effects caused by the vertical component Bz of the magnetic field can be reduced. Further, an electric field E toward the rear of FIG. 2 from the front thereof is generated. Accordingly, in the region corresponding to the magnetic force line generating unit 27, electrons revolves in a clockwise direction by the Lorentz force (see solid-line arrows of FIG. 2). At this time, the revolving electrons collide with molecules and atoms of the processing gas in the processing space S, and thus, plasma is generated. As a result, circular ring-shaped plasma is generated within the processing space S so as to correspond to the magnetic force line generating unit 27.

Likewise, in a region corresponding to the magnetic force line generating unit 28, a magnetic field is generated by the magnetic force lines 28d (see dashed-line arrows indicated of FIG. 2) radially distributed from the center of the magnetic force line generating unit 28, i.e., from the magnet row 28a toward the magnet row 28b. A vertical component Bz of this magnetic field is also sufficiently reduced as compared to a horizontal component Br thereof. As a result, without being adversely affected by the vertical component Bz of the magnetic field, circular ring-shaped plasma is generated in the region corresponding to the magnetic force line generating unit 28 within the processing space S. Further, in a region corresponding to the magnetic force line generating unit 29, a magnetic field is generated by the magnetic force lines 29d (see dashed-line arrows of FIG. 2) radially distributed from the center of the magnetic force line generating unit 29, i.e., from the magnet row 29b toward the magnet row 29a. A vertical component Bz of this magnetic field is also sufficiently reduced as compared to a horizontal component Br thereof. Thus, without being adversely affected by the vertical component Bz of the magnetic field, circular ring-shaped plasma is generated in the region corresponding to the magnetic force line generating unit 29 within the processing space S.

In accordance with the present illustrative embodiment, by setting the angle θ1 formed by axial lines of the magnets in each of the pairs of magnet rows 27a and 27b, 28a and 28b, and 29a and 29b of the magnetic force line generating units 27 to 29 to be an acute angle, e.g., about 45°, the vertical components of the magnetic fields generated within the processing space S by the magnetic force line generating units 27 to 29 can be sufficiently reduced as compared to the horizontal components. As a result, adverse effects caused by the vertical components can be reduced. Accordingly, the electric field E generated toward the upper electrode plate 23 within the processing space S can be effectively used. Due to the Lorentz force caused by the electric field E and the horizontal components of the magnetic fields generated within the processing space S by the magnetic force line generating units 27 to 29, electron flows are generated so as to revolve along the magnetic force line generating units 27 to 29. The electron flows collide with molecules and atoms in the processing gas within the processing space S. Accordingly, the circular ring-shaped plasma are generated in the regions corresponding to the magnetic force line generating units 27 to 29, and the plasma densities in these regions can be increased. As a consequence, a plasma density distribution within the processing space S can be controlled.

In the present illustrative embodiment, the plasma density within the processing space S may be varied by moving the magnetic force line generating units 27 to 29 individually or a specific combination thereof toward or away from the processing space S in the vertical direction of FIG. 1 by using a non-illustrated moving device. In this way, controllability of the plasma density distribution within the processing space S can be enhanced.

In the present illustrative embodiment, a moving device for moving one of the pair of magnet rows of each of the magnetic force line generating units 27 to 29 toward or away from the processing space S may be provided. In this configuration, the plasma density within the processing space S may be adjusted by moving one of the pair of magnet rows of each magnetic force line generating unit toward or away from the processing space S. As a consequence, controllability of the plasma density distribution within the processing space S can be further enhanced.

The present illustrative embodiment has been described for the configuration in which the magnetic field generating unit includes the three magnet force line generating units 27 to 29 arranged at a center position, a middle position and an edge position, respectively. However, the arrangement number of the magnetic force line generating units is not limited thereto, but may be appropriately modified depending on a dimension or a purpose of an apparatus.

In the present illustrative embodiment, within the processing space S, a sheath (not shown) is generated near the upper electrode plate 23 by a self bias electric potential generated in the upper electrode plate 23 by applying the high frequency power for plasma generation to the shower head 13. Further, there is also generated the electric field E, corresponding to the sheath, toward the upper electrode plate 23 from the processing space S. However, since this electric field E is not sufficient to control the plasma distribution within the processing space S, the second DC power supply 30 is connected between the upper electrode plate 23 of the shower head 13 and the susceptor 12 serving as the lower electrode, as described above. Further, instead of the second DC power supply 30, a high frequency power supply may be connected between the upper electrode plate 23 of the shower head 13 and the susceptor 12 serving as the lower electrode.

In the present illustrative embodiment, the angle θ1 formed by the axial lines of the magnets of the pair of magnet rows in the magnetic force line generating unit is set to an acute angle, e.g., about 45°. However, the angle θ1 is not limited to the acute angle and may be set within a range capable of reducing the vertical component of the magnetic field generated within the processing space S as compared to the horizontal component thereof. Desirably, the angle θ1 formed by the axial lines of the magnets of the pair of magnet rows in the magnetic force line generating unit may be set to be in a range of, e.g., about 0°<θ1≤180°. If there is no consideration of generation efficiency of the magnetic field, the angle θ1 may be set to be smaller than or equal to, e.g., about 270°.

In the present illustrative embodiment, each of the magnetic force line generating units 27 to 29 may be configured to include a single magnet row; and a yoke whose one end is connected to an end portion of the magnet row opposite to the processing space S and the other end thereof faces the processing space S. In addition, each of the magnetic force line generating units 27 to 29 may include a permanent magnet row having a reverse U-shaped cross section that is opened toward the processing space S.

Hereinafter, a second illustrative embodiment will be described.

Figure 3:
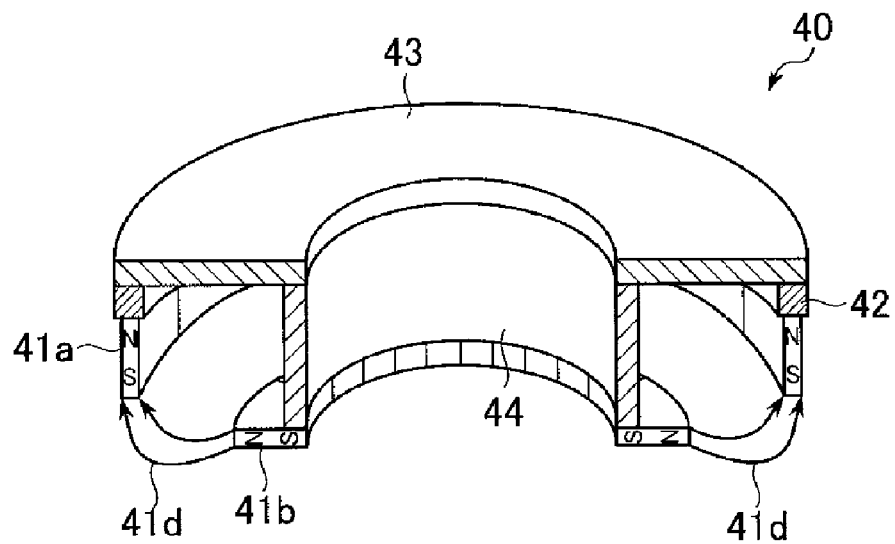
FIG. 3 is a perspective view schematically illustrating a cross section of a magnetic force line generating unit in accordance with a second illustrative embodiment when it is cut in a vertical direction.
Figure 3:

FIG. 3 is a perspective view schematically showing a cross section of a magnetic force line generating unit of a plasma processing apparatus in accordance with the second illustrative embodiment when it is cut in a vertical direction. In the magnetic force line generating unit, an angle θ1 formed by axial lines of magnets of a pair of magnet rows is set to be, e.g., about 90°.

Referring to FIG. 3, a magnetic force line generating unit 40 includes a pair of magnet rows 41a and 41b, and an angle θ1 formed by axial lines of the magnet rows 41a and 41b is set to be, e.g., about 90°. That is, the magnet row 41a and the magnet row 41b have a multiple number of permanent magnets disposed in a circular ring shape. Here, the permanent magnets of the magnet row 41b have magnetic poles opposite to those of the magnet row 41a. The magnet row 41a and the magnet row 41b are arranged such that the angle formed by axial lines of the magnets of the magnet rows 41a and 41b is set to be, e.g., about 90°. One end portions of the magnet rows 41a and 41b opposite to the processing space S are connected to each other by yokes 42 to 44 made of, e.g., iron or the like.

In the magnetic force line generating unit 40 configured as described above, the other end portions of the magnet rows 41a and 41b facing the processing space S are disconnected without being connected by the yolks. Further, since the magnetic poles at the other end portions of the magnet rows 41a and 41b are set to be different from each other, magnetic force lines 41d are generated between the other end portions thereof. The intensity of the magnetic force lines 41d depends on a magnitude of a magnetic force of the magnet rows 41a and 41b. In the present illustrative embodiment, however, when the magnetic force line generating unit 40 is positioned near the surface 13a of the shower head 13, the magnetic force lines 41d reach an upper region of the processing space S. At this time, since the magnet rows 41a and 41b are arranged such that the axial lines of their magnets form an angle of, e.g., about 90°, a vertical component Bz of a magnetic field generated by the magnetic force lines 41d is sufficiently reduced as compared to a horizontal component Br thereof.

Meanwhile, since a negative DC voltage is applied to the upper electrode plate 23 by the DC power supply 30, the electric field E is generated within the processing space S (see FIG. 1). As a result, electrons drifted by the Lorentz force revolve around the surface of the upper electrode about the center of the upper electrode. These revolving electrons collide with molecules and atoms of the processing gas, and thus, circular ring-shaped plasma is generated. As a result, the entire plasma density distribution within the processing space S can be controlled by the circular ring-shaped plasma.

In accordance with the second illustrative embodiment, by setting the angle θ1 formed by the axial lines of the magnets of the magnet rows 41a and 41b of the magnetic force line generating unit 40 to be, e.g., about 90°, the vertical component Bz of the magnetic field generated within the processing space S can be sufficiently reduced as compared to the horizontal component Br. As a result, the adverse effect caused by the vertical component Bz can be reduced. Due to Lorentz force caused by the electric field E generated by the DC power supply 30 and the horizontal component Br of the magnetic field generated by the magnetic force line generating unit 40, electron flows are generated to revolve within the processing space S. Accordingly, the plasma is generated by the electron flows, so that the plasma density distribution within the processing space S can be controlled.

Hereinafter, a modification example of the second illustrative embodiment will be described.

Figure 4:
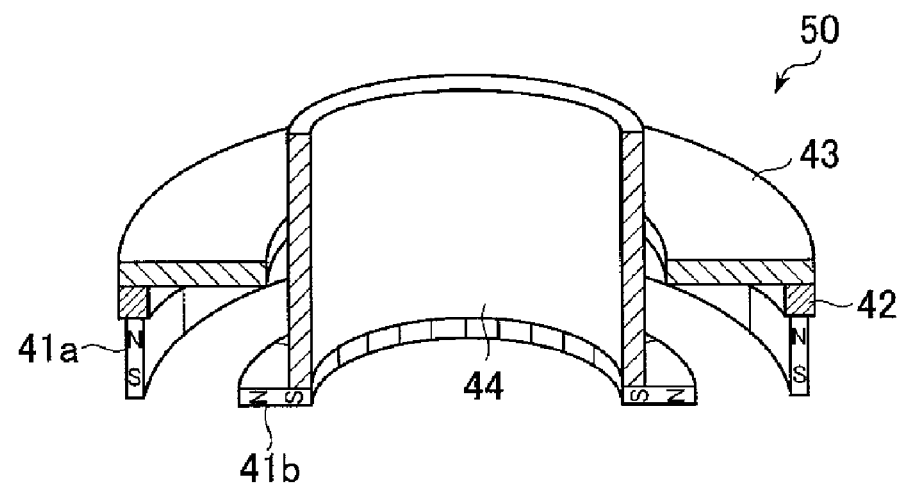
FIG. 4 is a perspective view schematically illustrating a cross section of a magnetic force line generating unit in accordance with a modification example of the second illustrative embodiment when it is cut in a vertical direction.

FIG. 4 is a perspective view schematically showing a cross section of a magnetic force line generating unit in accordance with a modification example of the second illustrative embodiment when it is cut in a vertical direction. This magnetic force line generating unit is configured such that one of a pair of magnet rows is individually movable.

Referring to FIG. 4, a magnetic force line generating unit 50 is different from the magnetic force line generating unit 40 shown in FIG. 3 in that yokes 43 and 44 are not connected, but spaced apart from each other with a certain gap therebetween and the magnet row 41b connected to the yoke 44 can be individually moved in a vertical direction by a non-illustrated moving device regardless of the magnet rows 41a.

In accordance with the present modification example, the magnet row 41b connected to the yoke 44 can be individually moved in the vertical direction so as to be separated from the top surface 13a of the shower head 13 regardless of the magnet row 41a. With this configuration, a part of magnetic force lines generated between the other end portions of the magnet rows 41a and 41b can be moved to the outside of the processing space S. Accordingly, by decreasing the intensity of a magnetic field within the processing space S corresponding to the magnetic force line generating unit 50, electron flows and the plasma density distribution can be controlled, so that controllability of the plasma density distribution can be enhanced.

In the present modification example, the magnet rows 41a and 41b are magnetically connected to each other via a space between the yokes 43 and 44.

Hereinafter, a third illustrative embodiment will be described.

Figure 5:
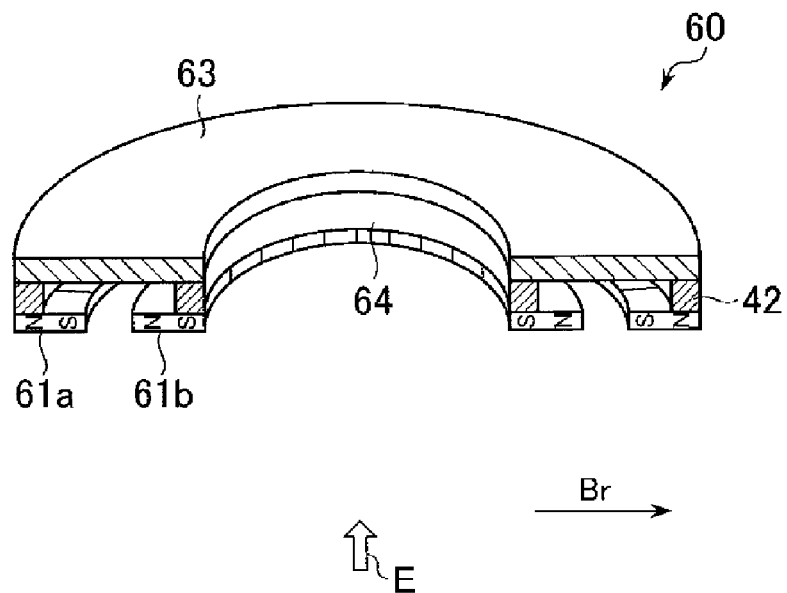
FIG. 5 is a perspective view schematically illustrating a cross section of a magnetic force line generating unit in accordance with a third illustrative embodiment when it is cut in a vertical direction.

FIG. 5 is a perspective view schematically showing a cross section of a magnetic force line generating unit of a plasma processing apparatus in accordance with a third illustrative embodiment when it is cut in a vertical direction.

Referring to FIG. 5, a magnetic force line generating unit 60 is different from the magnetic force line generating unit 40 shown in FIG. 3 in that an angle θ1 formed by axial lines of magnets of a pair of magnet rows 61a and 61b is set to be, e.g., about 180°.

In accordance with this third illustrative embodiment, by setting the angle θ1 formed by the axial lines of the magnets of the pair of magnet rows 61a and 61b set to be, e.g., about 180°, a vertical component of a magnetic field generated within a processing space S by the magnetic force line generating unit 60 can be set to be close to about zero (0). Hence, the adverse effect caused by the vertical component of the magnetic field can be almost removed. As a consequence, a plasma density distribution within the processing space S can be more precisely controlled.

Hereinafter, a fourth illustrative embodiment will be described.

Figure 6:
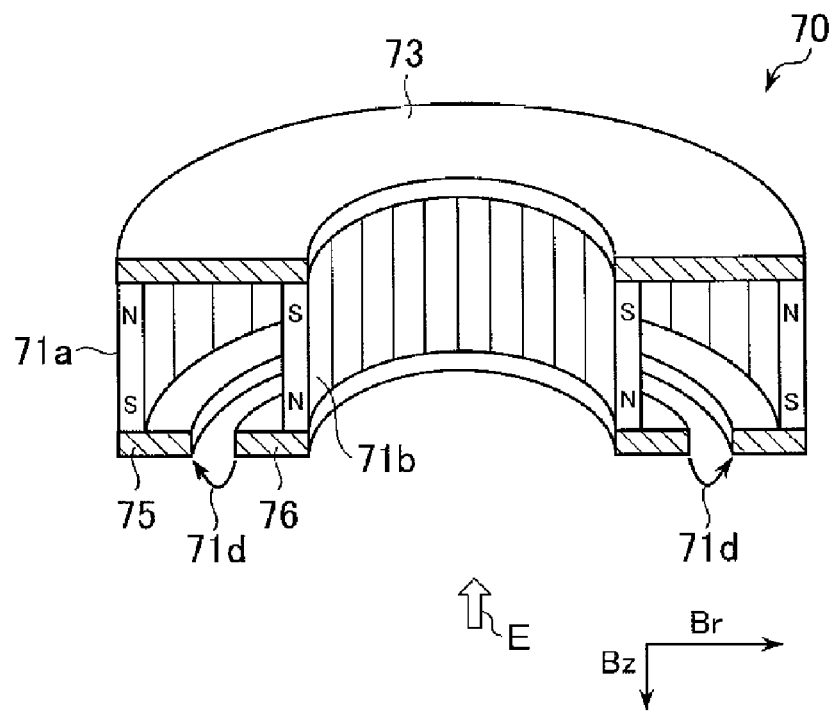
FIG. 6 is a perspective view schematically illustrating a cross section of a magnetic force line generating unit in accordance with a fourth illustrative embodiment when it is cut in a vertical direction.

FIG. 6 is a perspective view schematically showing a cross section of a magnetic force line generating unit of a plasma processing apparatus in accordance with a fourth illustrative embodiment when it is cut in a vertical direction. In this magnetic force line generating unit, yokes are connected to end portions of two horizontal magnet rows facing a processing space S, and an angle θ2 formed by axial lines of the two yokes is set to be, e.g., about 180°.

Referring to FIG. 6, a magnetic force line generating unit 70 includes a magnet row 71a and a magnet row 71b. The magnet row 71a and the magnet row 71b have a multiple number of permanent magnets arranged in a circular ring shape, respectively. Here, the permanent magnets of the magnet row 71b have magnetic poles reversed from those of the magnet row 71a. Further, the yokes 75 and 76 are connected to one end portions of the magnet rows 71a and 71b facing the processing space S, respectively. An end portion of the yoke 75 and an end portion of the yoke 76 are spaced apart from each other with a certain gap of, e.g., about 20 mm. Further, an angle θ2 formed by the axial lines of the yokes 75 and 76 is set to be, e.g., about 180°. Moreover, the other end portions of the magnet rows 71a and 71b opposite to the one end portions facing the processing space S are magnetically connected to each other by a circular ring-shaped yoke 73.

In the magnetic force line generating unit 70 configured as described above, the one end portions of the magnet rows 71a and 71b facing the processing space S are disconnected without being connected to each other, and the magnetic poles at the yokes 75 and 76 are different from each other. Accordingly, magnetic force lines 71d are generated between the end portions of the yokes 75 and 76. The intensity of the magnetic force lines 71d depends on a magnitude of a magnetic force of the magnet rows 71a and 71b. If the magnetic force line generating unit 70 is positioned near the top surface 13a of the shower head 13, the magnetic force lines 71d reach an upper region of the processing space S. Further, since the angle θ2 formed by the axial lines of the yokes 75 and 76 is set to be, e.g., about 180°, a vertical component Bz of the magnetic field generated by the magnetic force lines 71d becomes close to about zero (0). As a consequence, the vertical component Bz can be decreased sufficiently as compared to a horizontal component Br.

Meanwhile, since a negative DC voltage is applied to the upper electrode plate 23 from the DC power supply 30, an electric field E is generated in the processing space S (see FIG. 1). As a result, circular ring-shaped plasma is generated so as to correspond to the magnetic force line generating unit 70, and the entire plasma density distribution within the processing space S can be surely controlled.

In accordance with the present illustrative embodiment, by setting the angle θ2 formed by the axial lines of the yokes 75 and 76 in contact with the magnet rows 71a and 71b of the magnetic force line generating unit 70 to be, e.g., about 180°, a vertical component Bz of a magnetic field generated within the processing space S by the magnetic force line generating unit 70 becomes close to about zero (0). As a result, the vertical component Bz of the magnetic field can be sufficiently decreased as compared to a horizontal component Br thereof, so that adverse effect caused by the vertical component Bz can be removed. Due to Lorentz force caused by the electric field E generated by the DC power supply 30 and the horizontal component Br of the magnetic field generated by the magnetic force line generating unit 70, electron flows are generated to revolve within the processing space S. Accordingly, circular ring-shaped plasma is generated so as to correspond to the magnetic force line generating unit 70, and the plasma density distribution within the processing space S can be controlled effectively.

In the present illustrative embodiment, by adjusting the gap between the yokes 75 and 76, the intensity of the magnetic field generated within the processing space S can be controlled, and the plasma density within the processing space S can be also controlled.

In the present illustrative embodiment, the angle θ2 formed by the axial lines of the yokes 75 and 76 is set to, e.g., about 180°. However, the angle θ2 is not limited to, e.g., about 180° and may be set to be in a range of, e.g., about 0°<θ2≤180°. If there is no consideration of the generation efficiency of the magnetic field, the angle θ2 may be set to be smaller than or equal to, e.g., about 270°.

In the present illustrative embodiment, the yokes in contact with the one end portions of the magnet rows 71a and 71b facing the processing space S have annular shapes, e.g., circular ring shapes. Here, the circular ring-shaped yoke may be formed by connecting two semicircular ring-shaped yokes directly or indirectly with a gap therebetween.

Figure 7:
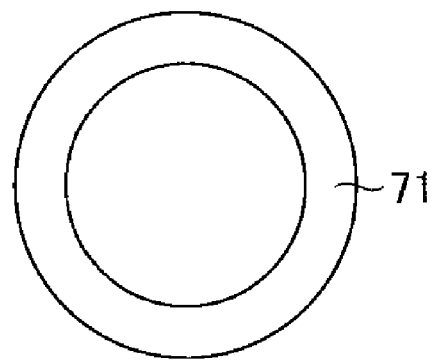
FIG. 7 provides plane views of circular ring-shaped yokes, and to be specific.
Figure 7:
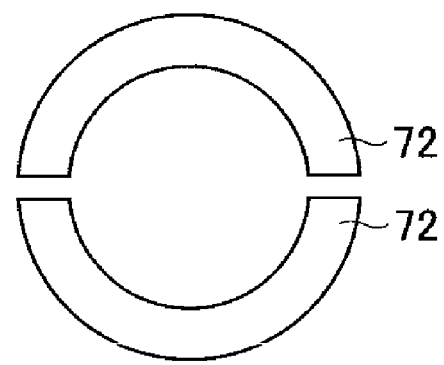

FIG. 7 provides explanatory diagrams showing circular ring-shaped yokes. FIG. 7(A) is a plane view of a circular ring-shaped yoke formed as a single body, and FIG. 7(B) is a plane view of a circular ring-shaped yoke formed by combining two semicircular ring-shaped yokes.

As shown in FIG. 7(B), by forming the circular ring-shaped yoke by combining two semicircular ring-shaped yokes 72, fabrication, assembly and handling thereof becomes much easier, as compared to the circular ring-shaped yoke 71 shown in FIG. 7(A).

Hereinafter, a modification example of the fourth illustrative embodiment will be described.

Figure 8:
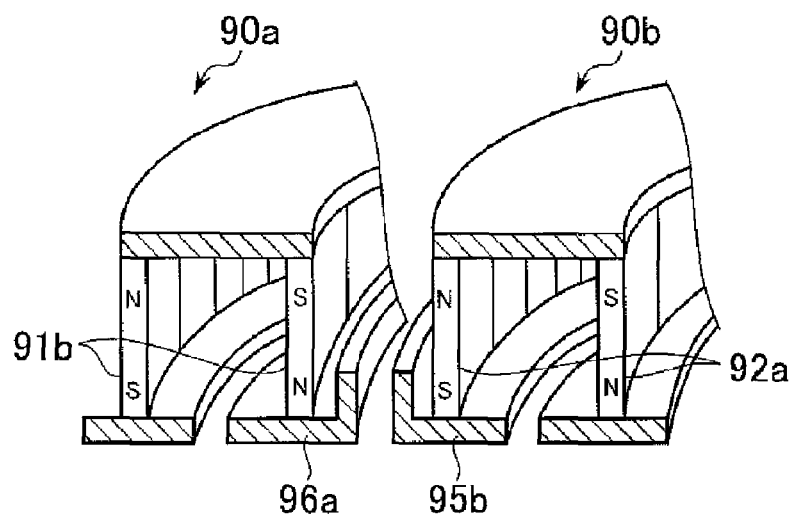
FIG. 8 provides explanatory diagrams illustrating a magnetic force line generating unit in accordance with a first modification example of the fourth illustrative embodiment, and to be specific.
Figure 8:
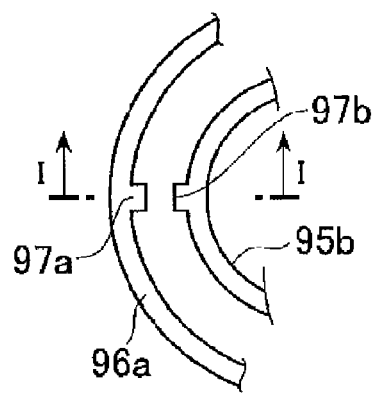
Figure 8:
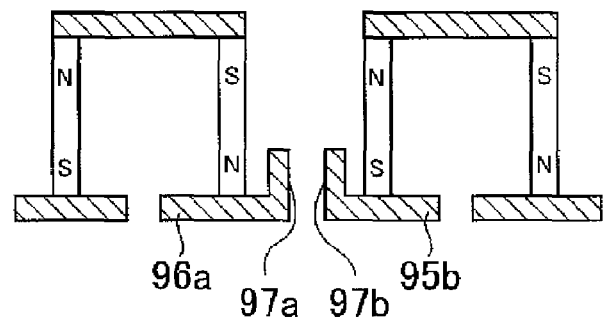

FIG. 8 provides explanatory diagrams of a magnetic force line generating unit in accordance with a first modification example of the fourth illustrative embodiment. FIG. 8(A) is a schematic perspective view partially showing a cross section of a pair of magnetic force line generating units that forms a magnetic field generating unit when it is cut in a vertical direction. FIG. 8(B) is a plane view showing a part of yokes connected to end portions at the processing space side of facing magnet rows in the pair of magnetic force line generating units shown in FIG. 8(A). FIG. 8(C) is a cross sectional view of the magnetic force line generating units corresponding to cross sections of the yokes taken along a line I-I shown in FIG. 8(B).

In this magnetic field generating unit, two magnetic force line generating units having the same configuration as that of the magnetic force line generating unit 70 shown in FIG. 6 are arranged in a concentric circular shape.

Referring to FIG. 8, two magnetic force line generating units 90a and 90b are arranged adjacent to each other in a concentric circular shape. Yokes are connected to end portions of two parallel magnet rows facing a processing space S, and an angle θ2 formed by axial lines of the two yokes is set to be, e.g., about 180°. A protrusion 97a is formed at the yoke 96a in contact with the end portion of the magnet row 91b of the magnetic force line generating unit 90a, and a protrusion 97b is formed at the yoke 95a in contact with the end portion of the magnet row 92a of the magnetic force line generating unit 90b. The protrusions 97a and 97b are respectively protruded toward the yokes 95b and 96a so as to face each other directly.

In accordance with this first modification example, by respectively forming the protrusions 97a and 97b at the yokes 96a and 95b of the two adjacent magnetic force line generating units 90a and 90b so as to face each other directly, the gap between the yokes 96a and 95b is decreased, so that a magnetic field is generated between the yokes 96a and 95b. Accordingly, a magnetic force between the magnetic force line generating units 90a and 90b is increased, and, thus, electron flows and plasma can be generated in a region within the processing space S where the magnetic force line generating units 90a and 90b correspond. As a result, the controllability of the plasma density within the processing space S can be increased.

Hereinafter, a second modification example of the fourth illustrative embodiment will be described.

Figure 9:
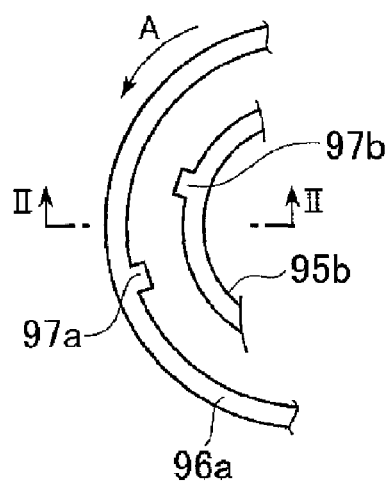
FIG. 9 provides explanatory diagrams illustrating a second modification example of the fourth illustrative embodiment, and to be specific.
Figure 9:
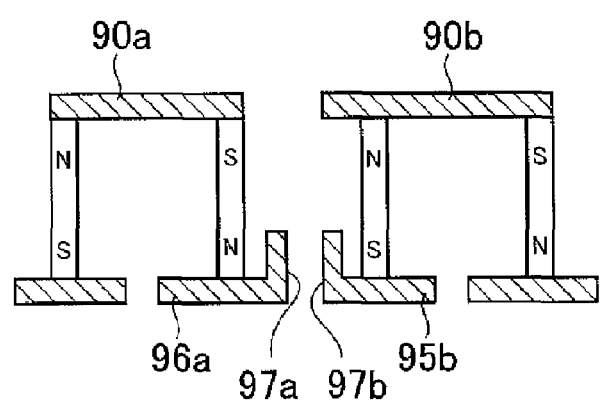
Figure 10:
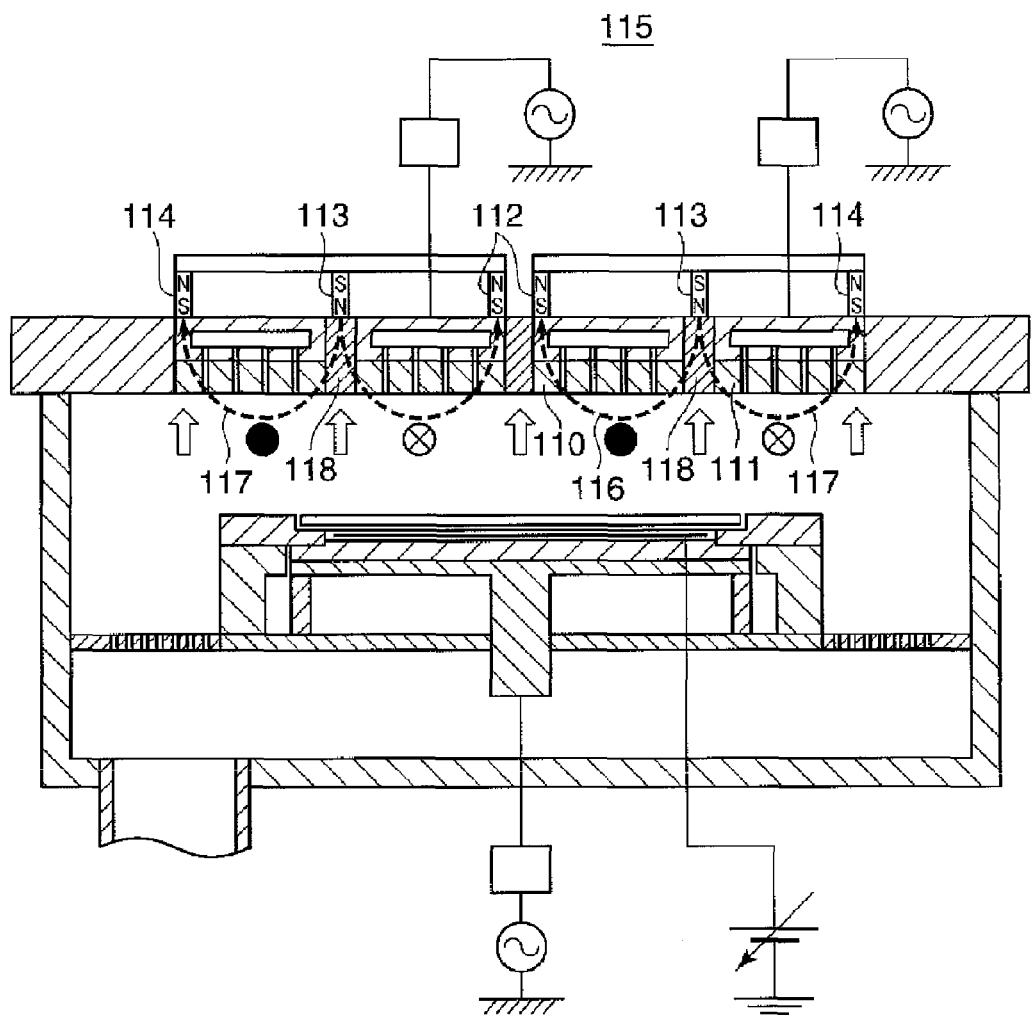
FIG. 10 is a cross sectional view schematically illustrating a configuration of a conventional plasma processing apparatus.

FIG. 9 provides explanatory diagrams illustrating a second modification example of the fourth illustrative embodiment. FIG. 9(A) is a plane view showing a part of yokes connected to end portions at the processing space side of facing magnet rows in a pair of magnetic force line generating units that forms a magnetic field generating unit. FIG. 9(B) provides a cross sectional view of the magnetic force line generating units corresponding to cross sections of the yokes taken along a line II-II of FIG. 9(A).

In magnetic force line generating units 90a and 90b in accordance with the second modification example of the fourth illustrative embodiment, by rotating one of the magnetic force line generating units 90a and 90b with respect to the other about a concentric central axis by a non-illustrated rotation device, protrusions 97a and 97b do not face each other directly.

Referring to FIG. 9, the magnetic force line generating unit 90a is slightly rotated in a direction indicated by an arrow A of FIG. 9(A) with respect to the magnetic force line generating unit 90b, and the protrusion 97a of the yoke 96a and the protrusion 97b of the yoke 95b do not face each other directly. Thus, a gap between the protrusions 97a and 97b is increased as compared to the example shown in FIG. 8(B). In this way, a magnetic field, which would be generated between the adjacent magnetic force line generating units 90a and 90b when the protrusions 97a and 97b face each other directly, disappears. As a result, electron flows and plasma generated in a corresponding region within the processing space S also disappear.

In accordance with the second modification example of the fourth illustrative embodiment, the protrusions 97a and 97b are respectively formed at the yokes 96a and 95b of the adjacent magnetic force line generating units 90a and 90b, and one of the magnetic force line generating units 90a and 90b is rotated with respect to the other. With this configuration, by adjusting the degree of rotation, electron flows and plasma generated within the processing space S can be controlled. As a result, the controllability of the plasma density within the processing space S can be increased.

Although the illustrative embodiments have been described in detail in the above, the present disclosure is not limited to the illustrative embodiments.

The illustrative embodiments are applicable to not only the plasma processing apparatus 10 configured to perform the plasma etching process on the wafer W for the semiconductor device, but also to a plasma processing apparatus configured to perform a plasma process on various substrates for a FPD (Flat Panel Display) such as a LCD (Liquid Crystal Display), a photomask, a CD substrate, a printed substrate, or the like. For example, although the upper electrode plate 23 has a circular plate shape in the above-described embodiments, the upper electrode plate may have rectangular shape in a plasma processing apparatus that processes a FPD. In such a case, it may be desirable that magnet rows or magnetic force line generating units are arranged in multiple rectangular shapes. That is, it is desirable to arrange the magnet rows or the magnetic force line generating units such that they have the same shape as the exterior shape of the upper electrode plate.

Further, the above-described illustrative embodiments or modification examples may be used by being combined with each other. For example, the magnetic force line generating unit 27 may be configured to be movable toward or away from the processing space S, or only the magnetic row 27a may be configured to be movable toward or away from the processing space S.

In addition, in the above-described illustrative embodiments, although all the magnetic force line generating units are located on the surface 13a of the shower head 13, the magnetic force line generating units may be placed at any positions facing the processing space S.

What is claimed is:

1. A plasma processing apparatus, having a lower electrode and an upper electrode positioned at a top of a chamber and facing the lower electrode, for performing a plasma process on a substrate mounted on the lower electrode by generating plasma in a processing space between the lower electrode and the upper electrode, the plasma processing apparatus comprising:

a magnetic field generating unit provided at an upper side of the upper electrode opposite to a lower side facing the processing space, wherein the magnetic field generating unit includes at least three magnetic force line generating units arranged in at least three corresponding concentric circles, each of the at least three magnetic force line generating units having a pair of annular magnet rows arranged at the upper side of the upper electrode, each magnet defining an axial line, wherein the pair of annular magnet rows is arranged such that an angle θ1 between the axial lines is set to be an acute angle such that a vertical component of a magnetic field generated in the processing space by the magnetic field generating unit is smaller than a horizontal component thereof, and wherein the at least three magnetic force line generating units are configured to be movable individually or in a specific combination toward or away from the processing space.

2. The plasma processing apparatus of claim 1, wherein one end portions of the pair of annular magnet rows opposite to the processing space are magnetically connected to each other, and magnetic force lines reaching the processing space are generated between the other end portions of the pair of annular magnet rows facing the processing space.

3. The plasma processing apparatus of claim 2, wherein the angle θ1 is set to be about 90°.

4. The plasma processing apparatus of claim 2, wherein the angle θ1 is set to be about 180°.

5. The plasma processing apparatus of claim 1, wherein the magnetic field generating unit includes at least one magnetic force line generating unit having a pair of annular magnet rows and two yokes, the pair of annular magnet rows being provided at the side of the upper electrode opposite to the side facing the processing space and arranged concentrically when viewed from the top, and the two yokes respectively being connected to one end portions of the pair of annular magnet rows facing the processing space, the pair of annular magnet rows in the at least one magnetic force line generating unit is arranged such that an angle θ2 formed by axial lines of the two yokes is set to be in a range of about 0°<θ2≤180°, the other end portions of the pair of annular magnet rows opposite to the one end portions facing the processing space are magnetically connected to each other, and magnetic force lines reaching the processing space are generated between end portions of the two yokes connected to the one end portions of the pair of annular magnet rows facing the processing space.

6. The plasma processing apparatus of claim 5, wherein the angle θ2 is set to be an acute angle.

7. The plasma processing apparatus of claim 5, wherein the angle θ2 is set to be about 90°.

8. The plasma processing apparatus of claim 5, wherein the angle θ2 is set to be about 180°.

9. The plasma processing apparatus of claim 1, wherein a DC power supply or a high frequency power supply is connected between the upper electrode and the lower electrode.

10. The plasma processing apparatus of claim 2, wherein one of the pair of annular magnet rows in the at least one magnetic force line generating unit is configured to be independently movable toward or away from the processing space.

11. The plasma processing apparatus of claim 5, wherein the at least one magnetic force line generating unit is plural in number, a protrusion is formed at a yoke connected to one of the pair of annular magnet rows in one magnetic force line generating unit and is protruded toward a yoke connected to one of the pair of annular magnet rows in adjacent other magnetic force line generating unit, and a distance between the yokes in two adjacent magnetic force line generating units when the protrusion is formed is smaller than a distance between yokes when the protrusion is not formed.

12. The plasma processing apparatus of claim 2, wherein the one end portions of the pair of annular magnet rows opposite to the processing space are magnetically connected to each other via an annular yoke when viewed from the top.

13. The plasma processing apparatus of claim 2, wherein the one end portions of the pair of annular magnet rows opposite to the processing space are magnetically connected to each other with a gap therebetween.

14. The plasma processing apparatus of claim 2, wherein the at least one magnetic force line generating unit includes a single magnet row and a yoke whose one end is connected to an end portion of the magnet row opposite to the processing space and the other end faces the processing space.

15. The plasma processing apparatus of claim 2, wherein the at least one magnetic force line generating unit includes a permanent magnet row having a reverse U-shaped cross section that is opened toward the processing space.

* * * * *